(12) United States Patent
Lung

(10) Patent No.: US 7,901,979 B2
(45) Date of Patent: Mar. 8, 2011

(54) METHOD OF FORMING A SMALL CONTACT IN PHASE-CHANGE MEMORY

(75) Inventor: Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/366,595

(22) Filed: Feb. 5, 2009

(65) Prior Publication Data
US 2009/0166603 A1   Jul. 2, 2009

Related U.S. Application Data

(62) Division of application No. 11/026,317, filed on Dec. 29, 2004, now abandoned.

(51) Int. Cl.
  *H01L 21/06* (2006.01)

(52) U.S. Cl. .......... 438/102; 257/4; 257/E21.068; 257/E45.001

(58) Field of Classification Search ............ 257/4, 257/E21.068, E45.001; 438/102, 103
See application file for complete search history.

(56) References Cited

U.S. PATENT DOCUMENTS

| | | | |
|---|---|---|---|
| 4,115,872 | A | 9/1978 | Bluhm |
| 6,514,788 | B2 | 2/2003 | Quinn |
| 6,569,705 | B2 | 5/2003 | Chiang et al. |
| 6,579,760 | B1 | 6/2003 | Lung |
| 6,597,009 | B2 | 7/2003 | Wicker |
| 6,764,894 | B2 | 7/2004 | Lowrey |
| 6,777,705 | B2 | 8/2004 | Reinberg et al. |
| 7,012,273 | B2 * | 3/2006 | Chen .............................. 257/4 |
| 2002/0080647 | A1 | 6/2002 | Chiang et al. |
| 2003/0073262 | A1 * | 4/2003 | Xu et al. ..................... 438/102 |
| 2004/0202033 | A1 * | 10/2004 | Lowrey ..................... 365/200 |
| 2005/0020021 | A1 * | 1/2005 | Fujiwara et al. ............. 438/303 |
| 2006/0006374 | A1 * | 1/2006 | Chang .......................... 257/2 |

FOREIGN PATENT DOCUMENTS

CN   1449021 A   10/2003

OTHER PUBLICATIONS

English Abstract of CN1449021.
* cited by examiner

*Primary Examiner* — Bradley K Smith
*Assistant Examiner* — Marvin Payen
(74) *Attorney, Agent, or Firm* — Stout, Uxa, Buyan & Mullins, LLP

(57) ABSTRACT

A method of fabricating a phase-change memory cell is described. The cross-sectional area of a contact with a phase-change memory element within the cell is controlled by a width and an exposed length of a bottom electrode. The method allows the formation of very small phase-change memory cells.

17 Claims, 12 Drawing Sheets

METHOD OF FORMING A SMALL CONTACT IN PHASE-CHANGE MEMORY

CROSS-REFERENCE TO RELATED APPLICATIONS

This application is a divisional of U.S. application Ser. No. 11/026,317, filed Dec. 29, 2004, now abandoned the entire contents of which are incorporated herein by reference.

BACKGROUND OF THE INVENTION

1. Field of the Invention

The present invention relates generally to semiconductor fabrication methods and, more particularly, to fabrication of a phase-change memory cell.

2. Description of Related Art

Electrically writable and erasable phase-change materials have traditionally been used for memory devices. Phase-change materials, which may be formed of chalcogenide materials, can be electrically switched between two structural states of generally crystalline and generally amorphous local order. The generally crystalline state is a phase in which the material's atoms and/or electrons form a repeatable lattice structure, whereas the atoms and/or electrons of the generally amorphous state are randomly distributed. The structural state can also be switched among a range of detectable structural states of local order between the extremes of completely crystalline and completely amorphous states.

Currently favored chalcogenide materials that are used for phase change memory applications typically contain mixtures of Te, Se, Ge, Sb, Bi, Pb, Sn, As, S, Si, P, and/or O. Because of the range of structural states, a given as-deposited stoichiometric chalcogenide material can have varied bulk conductivities. Generally speaking, the more crystalline local order the state has, the higher the conductivity of the material. Moreover, the conductivity of the material can be selectively and repeatably established via an electrical pulse of given voltage and duration, herein called a setting or resetting voltage. The conductivity remains stable until another setting or resetting voltage of comparable size is applied. Furthermore, the conductivity of the material appears to vary inversely with the setting or resetting voltage and does not depend upon the previous state of the material, i.e., the material lacks hysteresis.

The aforementioned materials can be used to store and retrieve information within a non-volatile, overwritable memory cell. When different setting or resetting voltages are employed to change the conductivity of the material, the corresponding conductivities can be distinguished by various means including, but not limited to, the application of a relatively smaller voltage across the material within the cell. If, for example, two distinct setting or resetting voltages are used, one memory cell is able to store and retrieve one bit of binary encoded data. If more than two distinct setting or resetting voltages are used, then one memory cell is able to store and retrieve an analog form that can represent multiple bits of binary encoded data. Since the chalcogenide materials are able to maintain their respective conductivities, the memory cells are non-volatile, in that no refreshes are necessary to keep the data stored. The memory cells can also be directly overwritten, meaning that no data erasures are necessary prior to storing new data within the cells.

It is known that chalcogenide phase-change memory is not easy to incorporate into a CMOS circuit because the chalcogenide material requires a relatively high current density to change its state. Reducing the cross-sectional area of the chalcogenide part can reduce the current requirement in direct proportion. Structures which have been developed and which reduce this cross-sectional area involve fabricating ultra small contacts and depositing the chalcogenide into the contacts. One of the methods of fabricating ultra small contacts involves using a dielectric film, i.e., a spacer, to further reduce the photolithographic limit as referenced in U.S. Pat. No. 6,111,264. This technique can reduce the cross-sectional area, but the shrinking ratio is limited by the spacer thickness. For example, if the pore diameter is 1600 Å and the spacer thickness is 400 Å, the shrinkage area ratio is only about 4:1. The minimum pore diameter is determined by the photolithography and the spacer thickness. The shrinkage ratio can be limited. Thus, it can be difficult to scale down the chalcogenide parts in this fashion. If the chalcogenide parts cannot be scaled down, then relatively large current is required to cause a state change in the material. A requirement for larger current corresponds to a requirement for greater power to operate an array of such memory cells.

There can be additional problems once the pores are scaled down. For instance, the uniformity of the pore-to-pore diameters can be poor. Moreover, the small pores can place constraints on the chalcogenide deposition process since it will be more difficult to deposit materials into the tiny openings. For example, in the context of pores formed using the process of the preceding paragraph, overhang of the spacer may partially or fully occlude the pore, further compromising the reliability of the deposition procedure. If the bottoms of the pores receive poor bottom coverage, the electrodes beneath them may not be able to predictably change the phases of the chalcogenide parts. If the phases are not repeatable when a given current is applied, the memory cell cannot reliably store data. Another critical issue arises in aligning phase-change material with a contacting electrode. Because of the large current densities which may be involved, even relatively small misalignments may create large changes in current density which may adversely affect the ability to program phase-change memory cells.

A need thus exists in the prior art for a method of reliably aligning a contacting electrode with a phase-change memory element. A further need exists for a method of fabricating an electrode for making contact with chalcogenide material using a relatively small cross-sectional area.

SUMMARY OF THE INVENTION

The present invention addresses these needs by providing a method of forming a phase-change memory cell wherein self-aligned contact between a phase-change memory element and a bottom electrode is established with a very small cross-sectional area. The method controls the size of the cross-sectional area by forming a bottom electrode above a substrate, the bottom electrode having a first dimension and a second dimension. A first portion of the bottom electrode is covered, and a second portion of the bottom electrode is exposed. The second portion has a width equal to the first dimension and an exposed length less than or equal to the second dimension. A phase-change material is disposed on the second portion of the bottom electrode, thereby forming a contact between the phase-change material and the bottom electrode. The contact has an area equal to a product of the width and the exposed length. According to an exemplary embodiment, the disposing of a phase-change material comprises disposing a chalcogenide material.

The invention herein disclosed further comprises a memory cell formed according to the method. An embodiment of the memory cell comprises a bit line disposed within a substrate and an isolation device that is formed above and makes contact with the bit line. A bottom electrode having a width and an exposed length is formed above the isolation device. This embodiment further comprises a phase-change material disposed on the bottom electrode, such that a contact between the bottom electrode and the phase-change material has a cross-sectional area equal to a product of the width and the exposed length. Typically, the phase-change material is formed of chalcogenide material.

Another embodiment of the present invention comprises an array of memory cells including bit lines disposed in a reference direction and word lines disposed in a direction other than the reference direction. Memory cells are located at intersections of bit lines and word lines. Each memory cell comprises a bottom electrode having a width and an exposed length, the bottom electrode being disposed between one of the word lines and one of the bit lines at one of the intersections. A phase-change material is disposed on the bottom electrode, such that a contact between the bottom electrode and the phase-change material has a cross-sectional area equal to a product of the width and the exposed length.

The present invention further comprises a method of operating a phase-change memory cell comprising a method for resetting and setting the phase-change memory cell. The method of resetting the phase-change memory cell comprises applying an amorphizing current pulse to the phase-change memory cell, such that a temperature of a phase-change memory element within the phase-change memory cell is raised above a first temperature. The amorphizing current pulse further causes the temperature of the phase-change memory element to remain above a second temperature less than the first temperature for a first time interval. The method of setting the phase-change memory cell comprises applying a crystallizing current pulse to the phase-change memory cell, such that the temperature of the phase-change memory element is raised to a temperature above the second temperature and such that the temperature of the phase-change memory element is caused to remain above the second temperature for at least a second time interval. The duration of the second time interval is greater than the duration of the first time interval.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
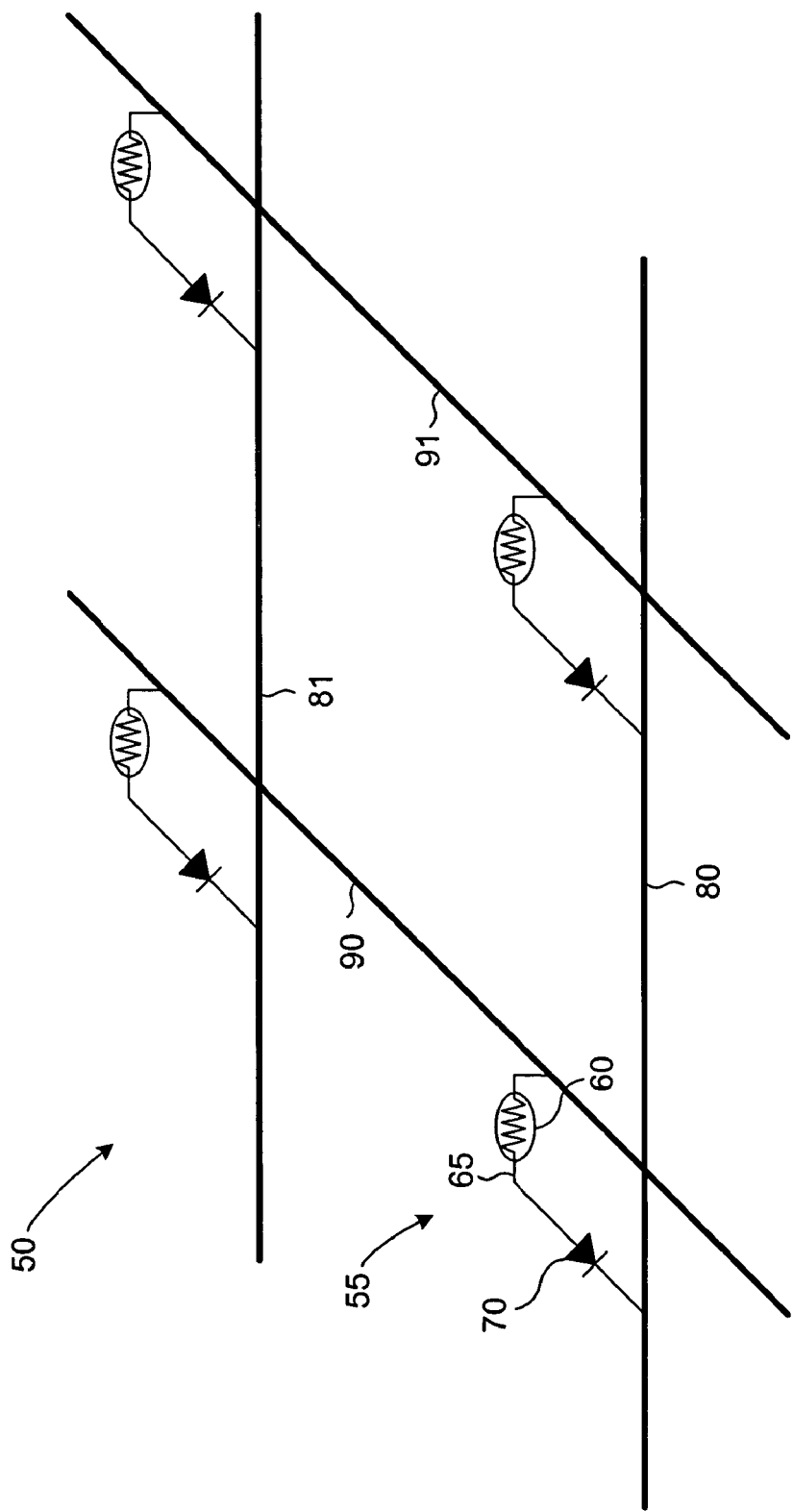
FIG. 1 is a schematic diagram of a portion of an embodiment of an array of phase-change memory cells.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of chalcogenide memory structures. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIG. 1 is a schematic diagram of a portion of an embodiment of an array 50 of phase-change memory cells. An illustrated phase-change memory cell 55 comprises a phase-change memory element 60 electrically connected to a word line 90. The phase-change memory element 60 may be formed of chalcogenide material. An isolation device 70 in the illustrated embodiment connects the phase-change memory element 60 to a bit line 80 through a bottom electrode 65. Although FIG. 1 illustrates four phase-change memory cells for simplicity, a typical array may comprise thousands of such cells. Two bit lines 80 and 81 and two word lines 90 and 91 are shown in FIG. 1. Again, typical phase-change memory arrays may comprise large numbers of bit and word lines that connect to control circuitry capable of applying setting and resetting voltages to phase-change memory cells. For example, to operate phase-change memory cell 55, a setting or resetting potential may be applied between word line 90 and bit line 80, phase-change memory cell 55 being located at the intersection of word line 90 and bit line 80.

Figure 2:
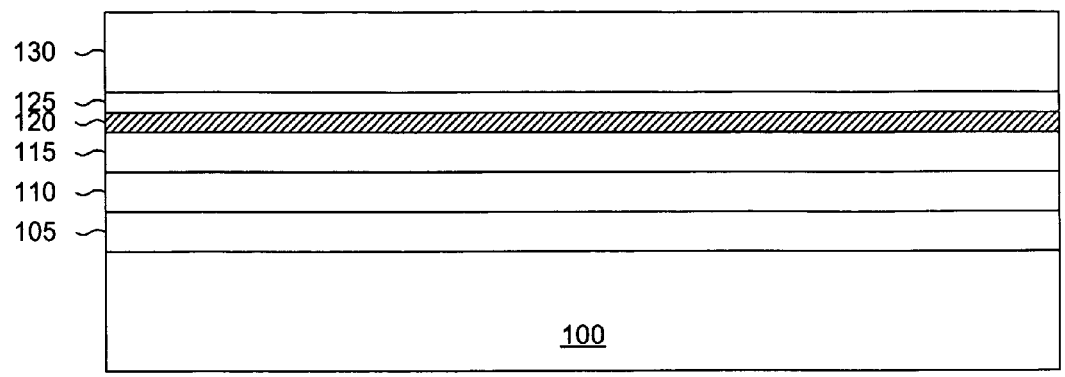
FIGS. 2-6 are cross-sectional diagrams showing results of early steps of a method of forming a phase-change memory cell in accordance with the present invention.

FIG. 2 is a cross-sectional diagram that illustrates processing layers associated with the fabrication of an embodiment of a phase-change memory cell. Although reference is made in the text to a single phase-change memory cell, the diagrams to follow illustrate a plurality of phase-change memory cells formed on a single substrate. The method herein disclosed may apply to the formation of a relatively large number of such phase-change memory cells on one or more substrates.

According to a typical embodiment, fabrication of a phase-change memory cell comprises forming several doped layers on a P-type substrate 100 using methods well known in the art. The P-type substrate 100 may be formed of silicon doped with, for example, about $10^{11}$-$10^{13}$ atoms of boron per cubic centimeter. An N+ layer 105 comprising silicon doped with, for example, about $10^{14}$-$10^{16}$ atoms of phosphorous or arsenic per cubic centimeter may be formed above the P-type substrate 100. In the illustrated embodiment, an N− layer 110 formed of silicon doped with, for example, about $10^{12}$-$10^{14}$ of dopant atoms per cubic centimeter overlies the N+ layer 105. A P+ layer 115, formed by doping intrinsic silicon to a concentration of about $10^{14}$-$10^{16}$ dopant atoms per cubic centimeter, overlies the N− layer 110. According to a representative embodiment of the phase-change memory cell, the N+ layer 105 is used to form a bit line, and the P+/N− layers 115/110 form a PN diode that functions as an isolation device 70 as introduced in FIG. 1. These details are more fully described in that which follows.

A silicide layer 120 formed, for example, of tungsten silicide, cobalt silicide, or titanium silicide, overlies the P+ layer 115, and a buffer layer 125 is formed over the silicide layer 120. The buffer layer 125 may comprise a layer of insulating material formed of, for example, silicon dioxide. A silicon nitride layer 130 overlies the buffer layer 125.

Figure 3:
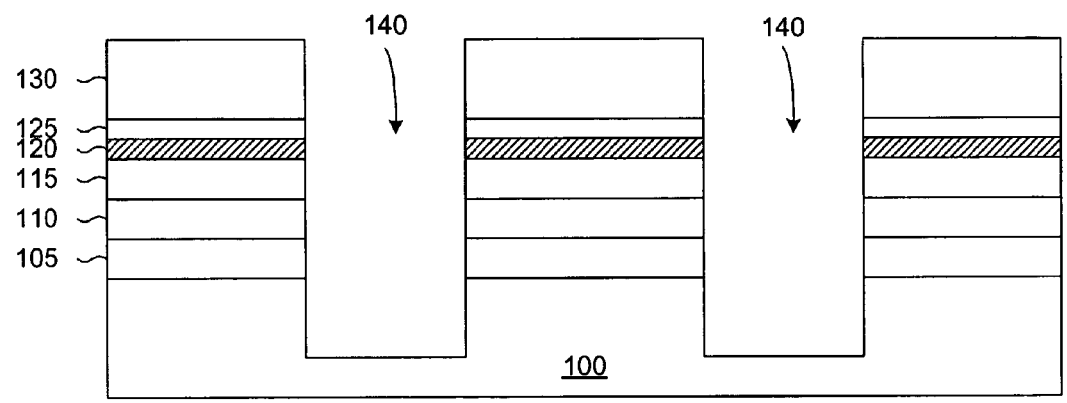

FIG. 3 is a cross-sectional view of a result of forming trenches 140 in the layered structure described in FIG. 2. The trenches 140 may be formed by coating an upper surface of the layered structure with a photoresist material and patterning the photoresist layer using a photolithographic process. The materials that form the layered structure may then be etched according to the photoresist pattern. The etch operation may include, for example, multiple etching processes performed in sequence. For example, a first etch process may be a selective etch process (e.g., a dry plasma etch process) in which the etchant has a higher selectivity for nitride than for oxide. The first etch process may remove material in the silicon nitride layer 130. A second etch process may be a selective etch process (e.g., a dry plasma etch process) in which the etchant has a higher selectivity for oxide than for silicide. The second etch process may remove material in the buffer layer 125. A third etch process, which may remove material in the silicide layer 120, may be a selective etch process in which the etchant has a higher selectivity for silicide than for silicon. A fourth etch process (e.g., a dry plasma etch process) may be used to etch silicon that forms the P+ layer 115, the N− layer 110, the N+ layer 105, and a portion of the P-type substrate 100.

Figure 4:
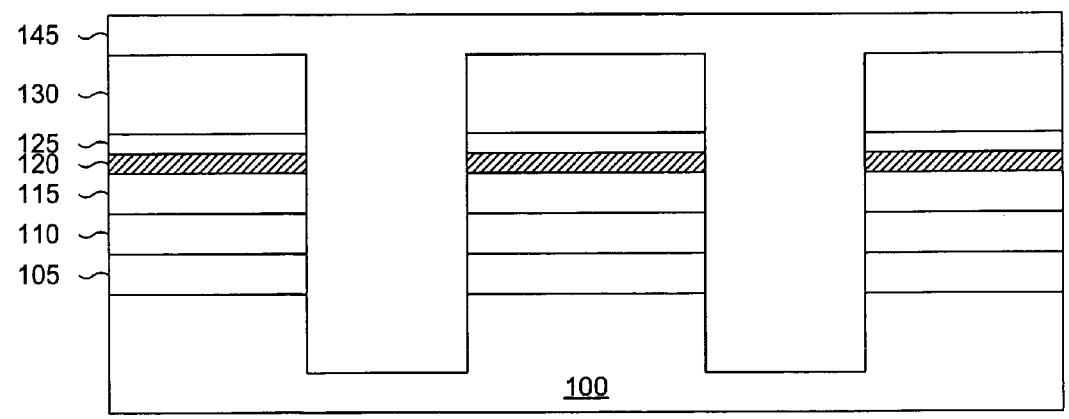
Figure 5:
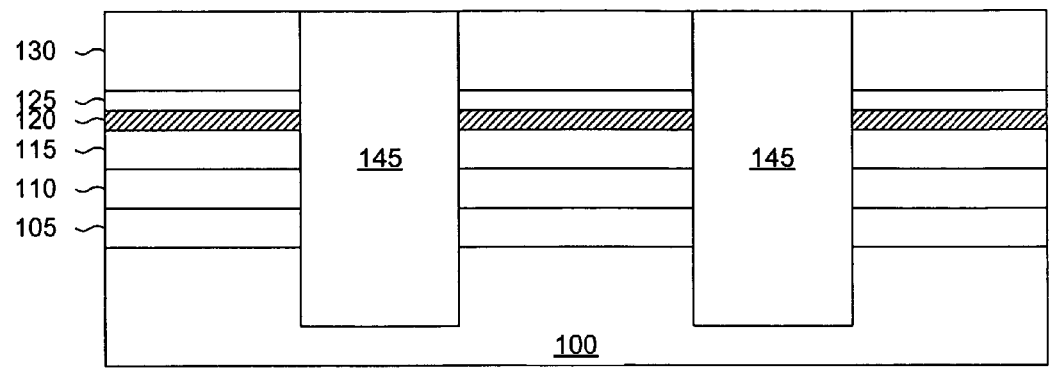

FIG. 4 is a cross-sectional diagram describing the result of depositing HDP oxide 145 on the structure illustrated in FIG. 3. The HDP oxide 145 fills the trenches 140 (FIG. 3) and overlies the silicon nitride layer 130. FIG. 5 is a cross-sectional diagram illustrating the result of performing chemical mechanical polishing (CMP) on the HDP oxide 145. The CMP operation nominally is terminated at an upper surface of the silicon nitride layer 130.

Figure 6:
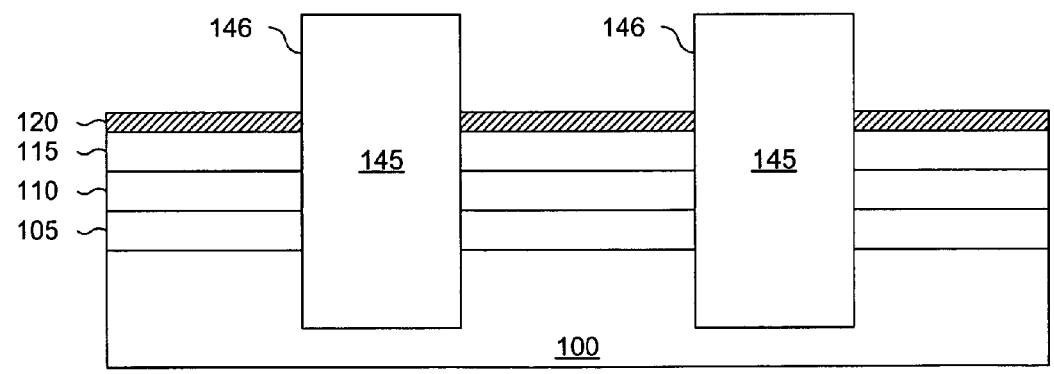

The cross-sectional diagram of FIG. 6 depicts the result of selectively removing the silicon nitride layer 130 and the buffer layer 125 from the structure illustrated in FIG. 5. The removing may include, for example, at least one or multiple etching processes performed in sequence. For example, a first etch process may be used to remove the silicon nitride layer 130 using an etchant having a higher selectivity for nitride than oxide, and a second etch process may be used to remove the buffer layer 125 in which the etchant has a higher selectivity for oxide than silicide. In one implementation, the silicon nitride layer 130 may be removed using hot phosphoric acid. The effect of the removal is to form features 146 of HDP oxide material 145 that extend above the silicide layer 120.

Figure 7:
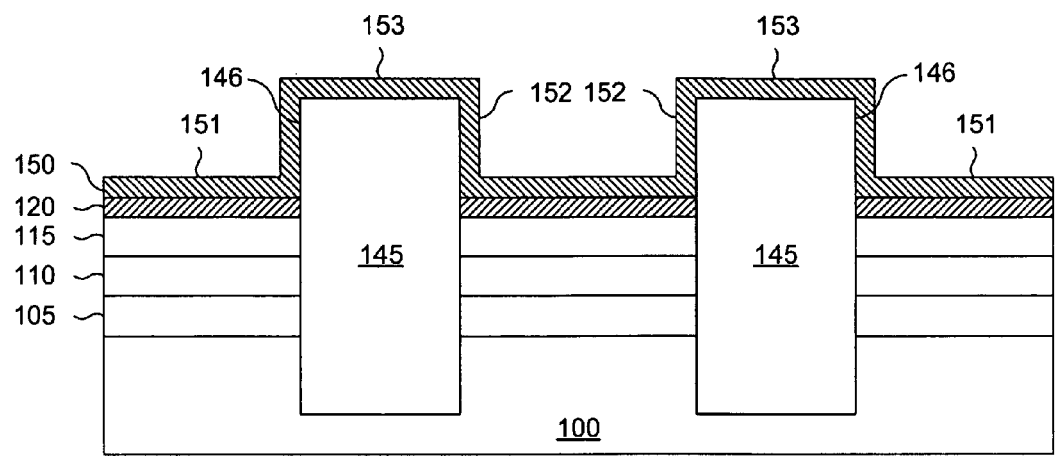
FIGS. 7-12 are cross-sectional diagrams illustrating formation of a bottom electrode according to the present invention.

FIG. 7 is a cross-sectional diagram illustrating the result of depositing a film of conducting material 150 on exposed surfaces of the structure of FIG. 6. The conducting material 150 covers the silicide material 120, thereby forming a lower horizontal portion 151 of conducting material 150. The conducting material 150 also is deposited on side walls of the features 146 formed by the HDP oxide material 145, thereby forming a vertical portion 152 of conducting material 150. An upper horizontal portion 153 of the conducting material 150 overlies the features 146 formed by the HDP oxide material 145. The vertical portion 152 and the lower horizontal portion 151 of the conducting material 150 will be used in later steps of the method to form a bottom electrode 65 for the phase-change memory cell 55 as schematically illustrated in FIG. 1. According to a typical embodiment, the conducting material 150 may comprise polysilicon or a metal such as TiN, TiAlN, Ta, TaN or TiW and may be deposited by a process such as chemical vapor deposition (CVD) or physical vapor deposition (PVD). The conducting material 150 can be deposited in typical embodiments to a thickness ranging from about 50 Å to about 500 Å, and in an illustrative embodiment can be deposited to a thickness of about 100 Å.

Figure 8:
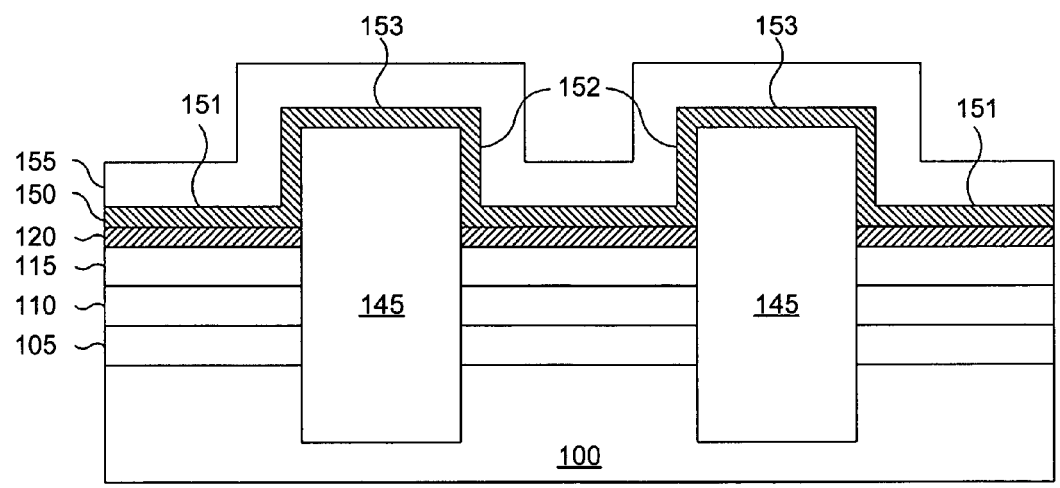
Figure 9:
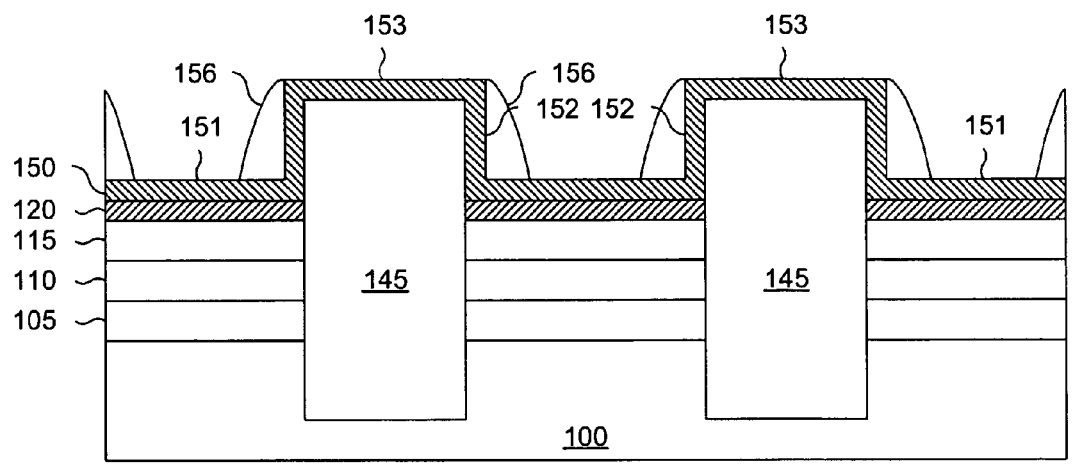

A cross-sectional diagram describing the result of disposing an oxide layer 155 on the conducting material 150 is shown in FIG. 8. The oxide layer 155 may comprise silicon dioxide according to an exemplary embodiment and typically is deposited using a CVD process. In accordance with the illustrated embodiment, the oxide layer 155 is applied uniformly over substantially all of the exposed surfaces of the structure to a thickness of about 300 Å to about 3000 Å. Oxide spacers 156 (FIG. 9) can be formed by performing an anisotropic etch on the structure depicted in FIG. 8. The anisotropic etch is directed in a nominally vertical direction in order to remove horizontal portions of the oxide layer 155 (FIG. 8) while leaving residual oxide spacers 156, as shown in FIG. 9, that cover the vertical portions 152 and part of the lower horizontal portions 151 of the conducting material 150. As presently embodied, all horizontally-disposed regions of the oxide layer 155 are etched by application of, for example, a reactive ion beam downwardly directed onto the substrate. The characteristics of pressure and power, for example, can be varied in the anisotropic etching process to accelerate ions vertically as opposed to at angles. The residual oxide spacers 156 of FIG. 9 have rounded or curved shapes in the illustrated embodiment and serve to narrow openings generally defined between features 146 of HDP oxide material 145.

Figure 10:
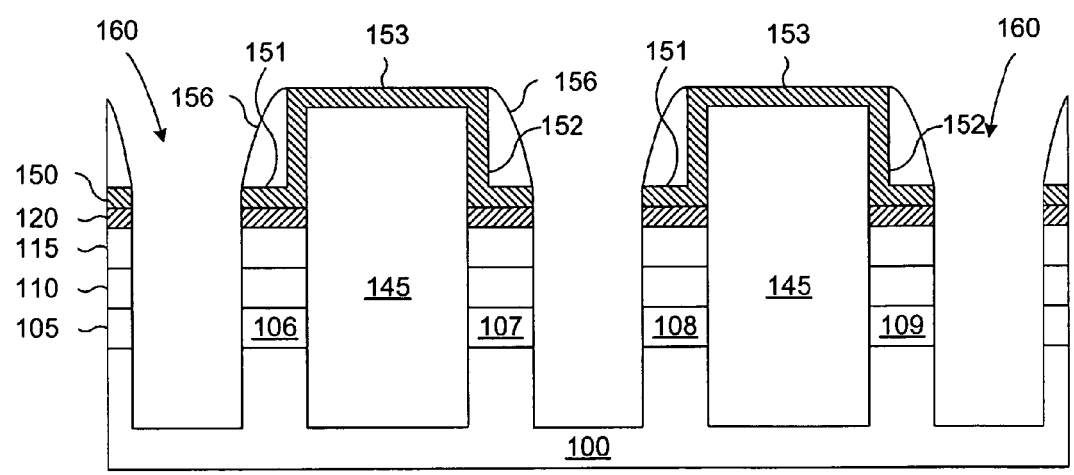

With reference to FIG. 10, trenches 160 are next formed in the structure of FIG. 9. The trenches 160 may be generated by using the oxide spacer as the hard mask and then etching according to the oxide spacer pattern. The etch operation may include, for example, multiple etching processes performed in sequence. For example, a first etch process may be a selective etch process in which the etchant has a higher selectivity for the conducting material 150 than for silicide and oxide, to thereby facilitate removal of exposed lower horizontal portions 151 of the conducting material 150. A second etch process, which may remove material in the silicide layer 120, may be a selective etch process in which the etchant has a higher selectivity for silicide than for silicon and oxide. A third etch process may be used to etch silicon that forms the P+ layer 115, the N– layer 110, the N+ layer 105, and a portion of the P-type substrate 100, while continuing to use the patterned photoresist and oxide spacers 156 as masks.

The formation of the trenches 160 has the effect of establishing self-aligned bit lines 106-109 formed of the N+ layer 105. According to an exemplary embodiment, the bit lines 106-109 extend in a direction nominally orthogonal to, i.e., into, the plane of the diagram.

Figure 11:
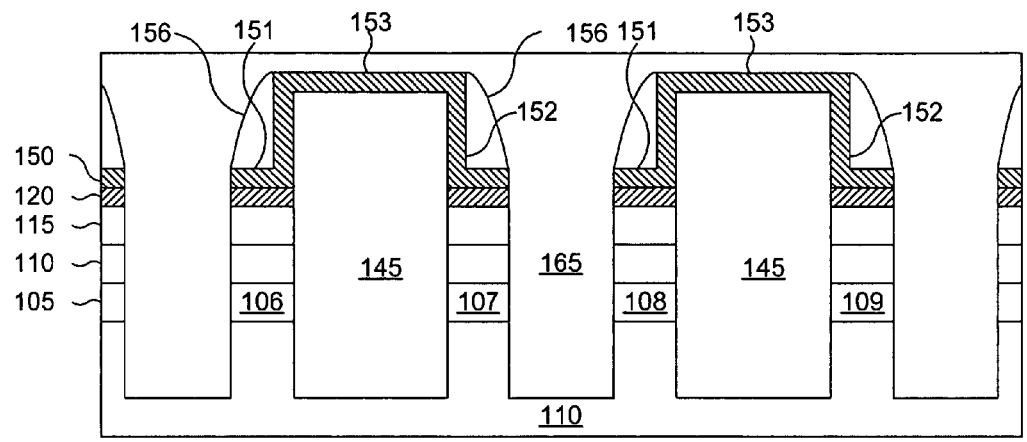
Figure 12:
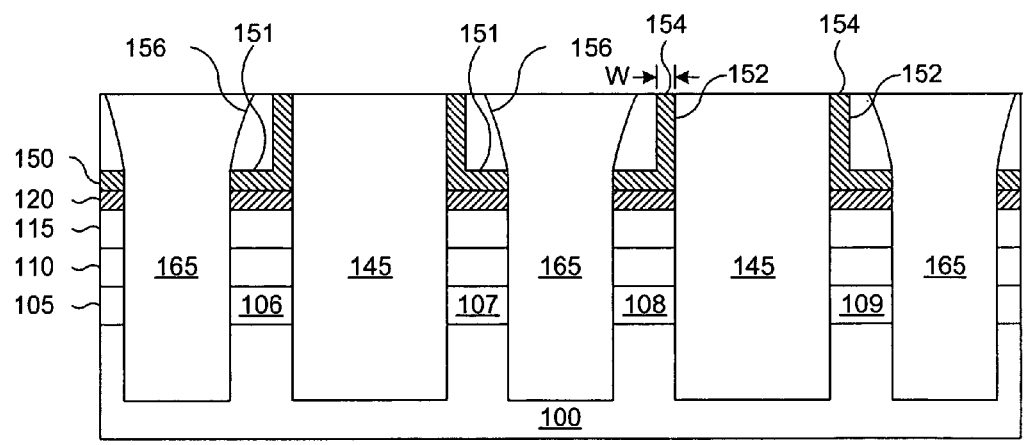

Turning to the cross-sectional diagram of FIG. 11, the structure of FIG. 10 is modified through formation of a HDP oxide 165 over the oxide spacers 156 and the upper horizontal portions 153 of the conducting material 150 and into the trenches 160 (FIG. 10). FIG. 12 is a cross-sectional diagram depicting the result of performing a CMP operation on the structure illustrated in FIG. 11. The CMP operation removes a portion of the HDP oxide 165, a portion of the oxide spacers 156, and the upper horizontal portion 153 (FIG. 11) of the conducting material 150. Removing the upper horizontal portion 153 of the conducting material 150 exposes a surface 154 of the vertical portion 152 of conducting material 150. The exposed surface 154, which may comprise a bottom electrode for a phase-change memory cell at a later step in the process, has a width W which may in one embodiment be determined by the thickness of the layer of conducting material 150. It should be noted that the width W, which may be referred to as a first dimension of a contact between phase-change material 190 (FIG. 20) and the exposed surface 154 of the bottom electrode, does not depend upon parameters of a photolithographic process. As noted above with reference to FIG. 7, the width W, i.e. the thickness of the layer of conducting material 150, can range from about 50 Å to about 500 Å.

Figure 13:
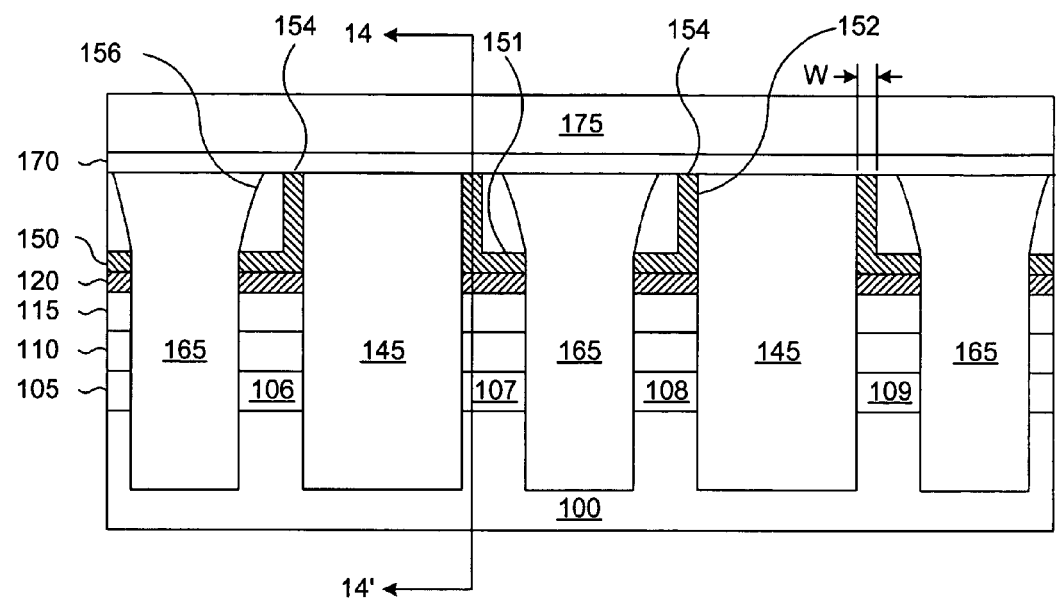
FIG. 13 is a cross-sectional diagram depicting the result of depositing layers of insulating material on the structure of FIG. 12.

FIG. 13 is a cross-sectional diagram showing the result of depositing a layer of silicon dioxide 170 and a layer of silicon nitride 175 on the device of FIG. 12. According to typical embodiments, the silicon dioxide 170 may be deposited using a CVD process to a thickness ranging from about 100 Å to about 500 Å. In an illustrative embodiment, the thickness of the silicon dioxide layer may be about 300 Å. The silicon nitride material 175 overlies the silicon dioxide 170 in the illustrated embodiment. The silicon nitride material 175 may be deposited using a CVD process to a depth of about 1500 Å.

Figure 14:
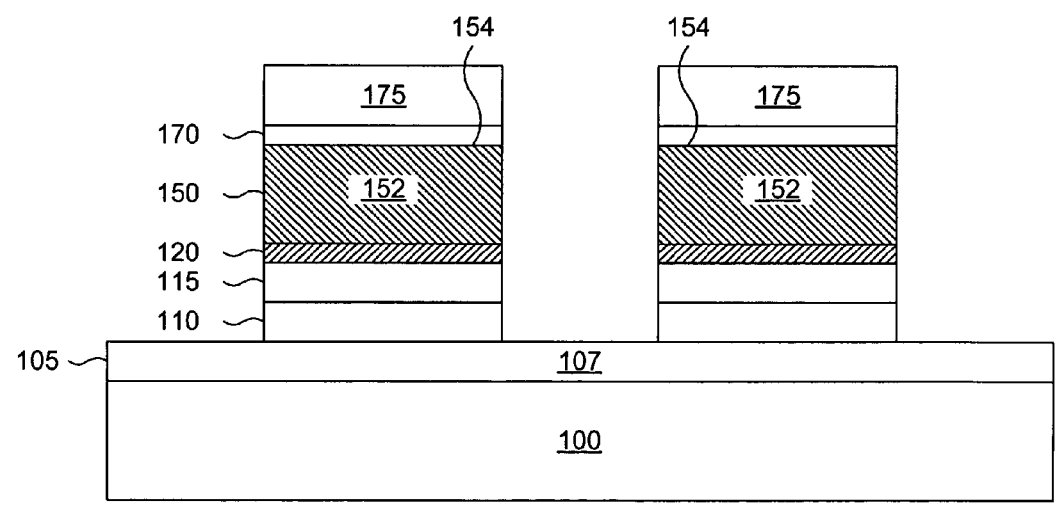
FIG. 14 is a cross-sectional diagram taken along a line 14-14' of FIG. 13 showing the effect of word line patterning.

FIG. 14 is a cross-sectional diagram illustrating the result of patterning and etching the layers of the structure of FIG. 13 using known techniques to expose bit line 107. The view depicted in FIG. 14 is taken along a line 14-14' shown in FIG. 13. The patterning and etching procedure may comprise performing multiple etching processes in sequence similar to those described above. The etching procedure forms stacks of layers that correspond to elements of a phase-change memory cell 55 as introduced schematically in FIG. 1.

Figure 15:
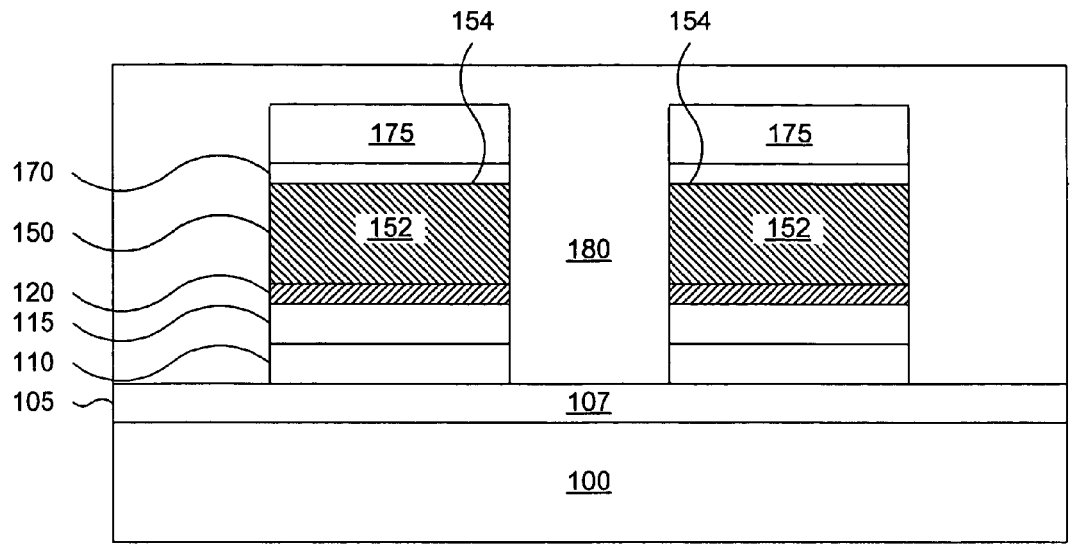
FIGS. 15-16 are cross-sectional views of the structure of FIG. 14 after filling with HDP oxide and performing CMP.
Figure 16:
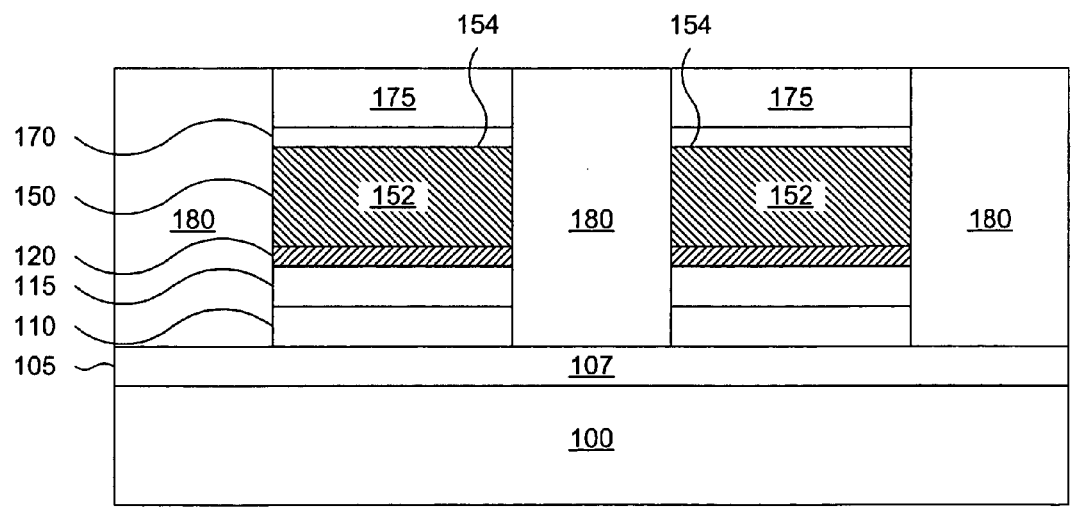

An HDP oxide 180 is then deposited over the structure illustrated in FIG. 14 to obtain the configuration shown in FIG. 15. The HDP oxide 180 provides isolation between the stacks of layers illustrated in FIG. 14. With reference to FIG. 16, a CMP step is then performed to remove excess HDP oxide 180 from upper surfaces of the layer of silicon nitride 175.

Figure 17:
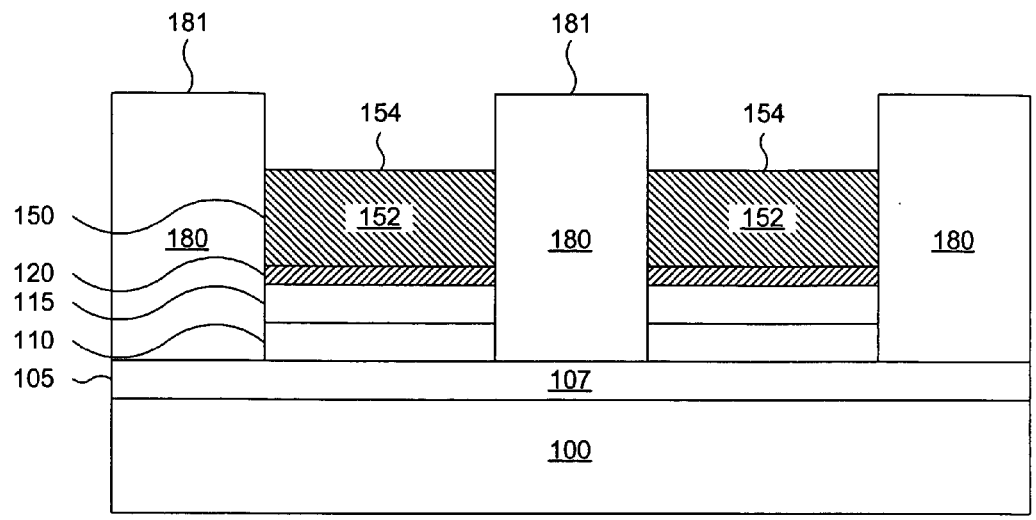
FIG. 17 is a cross-sectional view of the structure of FIG. 16 after oxide removal.

The layers of silicon nitride 175 are then removed as illustrated in FIG. 17. According to an exemplary embodiment, the layers of silicon dioxide 170 (FIG. 16) also are removed. Typically, the silicon nitride 175 can be removed by an etch process in which the etchant has a higher selectivity for silicon nitride than for HDP oxide. A second etch step may employ an etchant that has a higher selectivity for silicon dioxide than for HDP oxide and the material that forms the surface 154 of the bottom electrode. The removal of the silicon nitride 175 and silicon dioxide 170 layers exposes HDP oxide features 181, upper surfaces of which lie above the surface 154 of the bottom electrode. The surface 154 of the bottom electrode has a second dimension corresponding to a distance between features 181.

Figure 19:
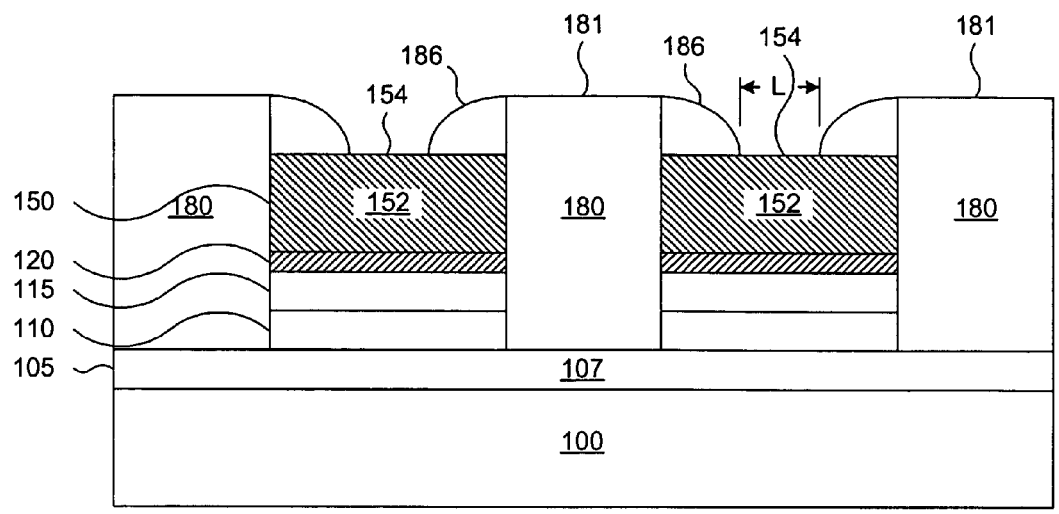

Silicon nitride spacers are then formed over portions of the surface 154 by first depositing a layer of silicon nitride material 185 over the surface 154 and over upper surfaces and side walls of the HDP oxide features 181. The silicon nitride material 185 may be deposited using a CVD process to a thickness of about 500 Å to about 1500 Å. An anisotropic etch using an etchant having a higher selectivity for silicon nitride than for the material that forms the bottom electrode may then be used to remove horizontal portions of the silicon nitride 185. Silicon nitride spacers 186, which may have curved or rounded shapes as shown in FIG. 19, then remain on sidewalls of the HDP oxide features 181 and over a portion of the surface 154 of the bottom electrode. A portion of the surface 154 of the bottom electrode is exposed by this process, the portion having an exposed length L determined by a distance between the silicon nitride spacers 186 as illustrated in FIG. 19. Normally, the exposed length L is less than the second dimension introduced above although the exposed length L may be equal to the second dimension in an embodiment where silicon nitride spacers 186 are not used.

Figure 18:
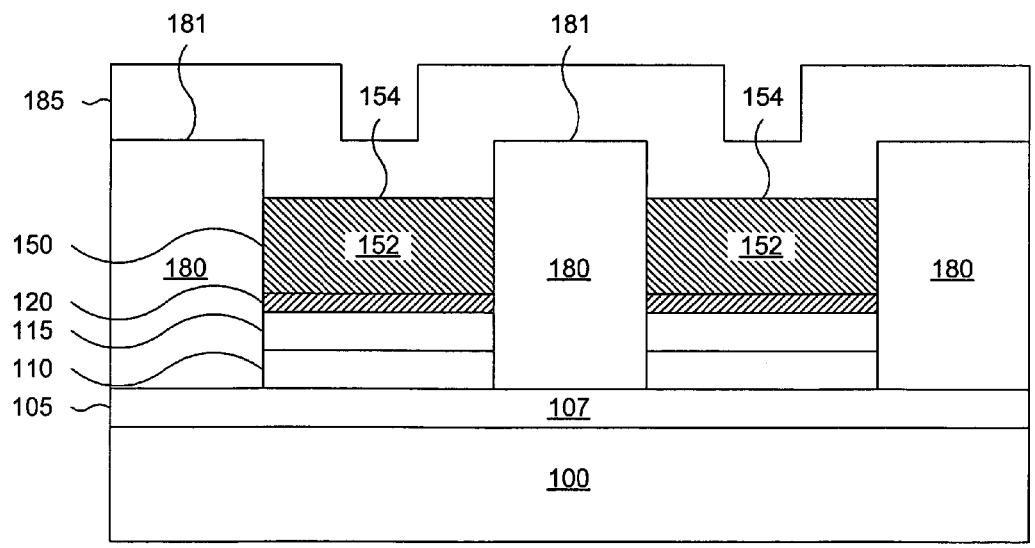
FIGS. 18-19 are cross-sectional views of the structure of FIG. 17 illustrating formation of silicon nitride spacers.
Figure 20:
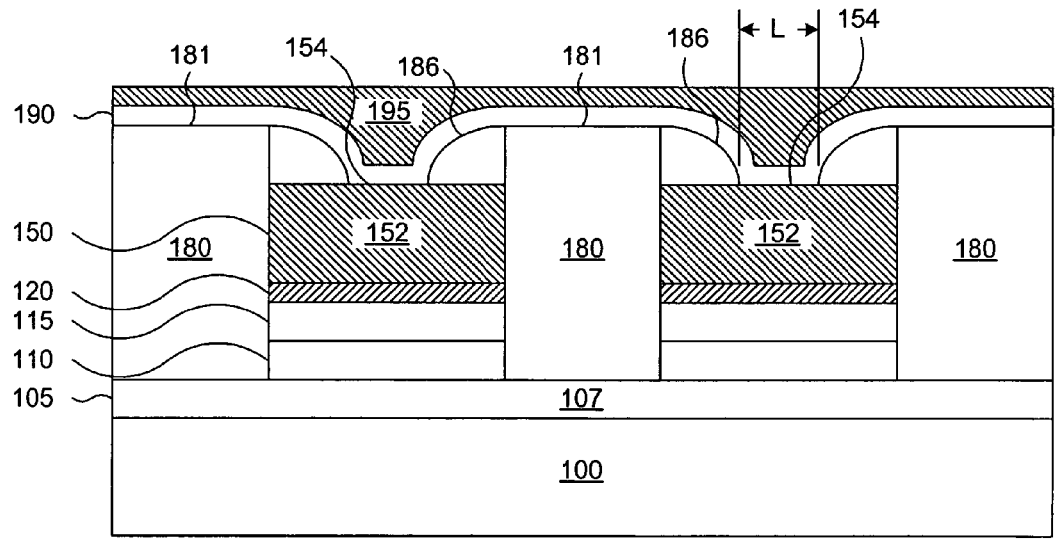
FIGS. 20-21 are cross-sectional views of the structure of FIG. 19 depicting deposition of phase-change material and formation of word lines to form at least one memory cell.

FIG. 20 illustrates a result of depositing a layer of phase-change material 190 on the structure of FIG. 19. The phase-change material 190, which may comprise a chalcogenide material, may be deposited using a CVD or PVD process to exemplary depths from about 100 Å to about 1000 Å, and in an illustrative example to a depth of about 500 Å. It should be noted that the phase-change material 190 makes contact with the surface 154 of the bottom electrode over the distance L controlled by the distance between the silicon nitride spacers 186 as described above. The contact is self-aligning in that the layer of phase-change material 190 covers the entire exposed surface 154 of the bottom electrode simply by being deposited thereon. The silicon nitride spacers 186 have dimensions controlled by the thickness of the silicon nitride layer 185 formed as illustrated in FIG. 18. In particular, the dimensions of the silicon nitride spacers 186 do not depend upon parameters of a photolithographic process. In a typical embodiment, the use of silicon nitride spacers 186 to control the exposed length L can yield values for L ranging from about 100 Å to about 1000 Å, a typical value for L being about 300 Å.

Figure 21:
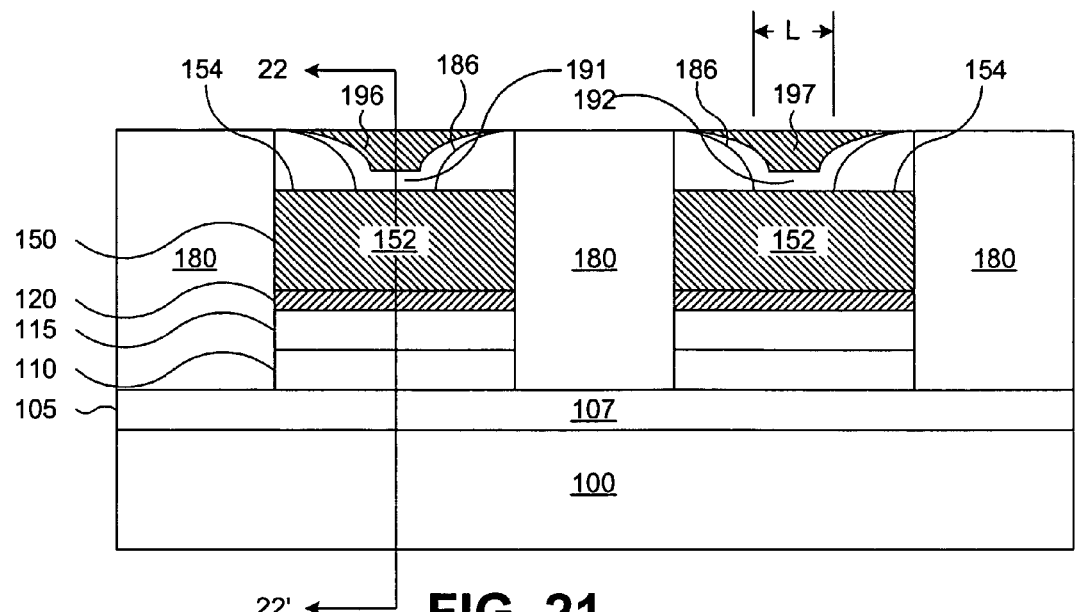

A layer of metal 195 then may be deposited over the phase-change material 190 as illustrated. The layer of metal 195 may be formed, for example, of tungsten, copper, or an aluminum/copper alloy. A CMP process may be used to remove a portion of the layer of metal 195 that extends above an upper surface of the HDP oxide 180 as illustrated in FIG. 21. Portions of the layer of metal 195 that are not removed form word lines 196 and 197 that make contact with the phase-change material.

Figure 22:
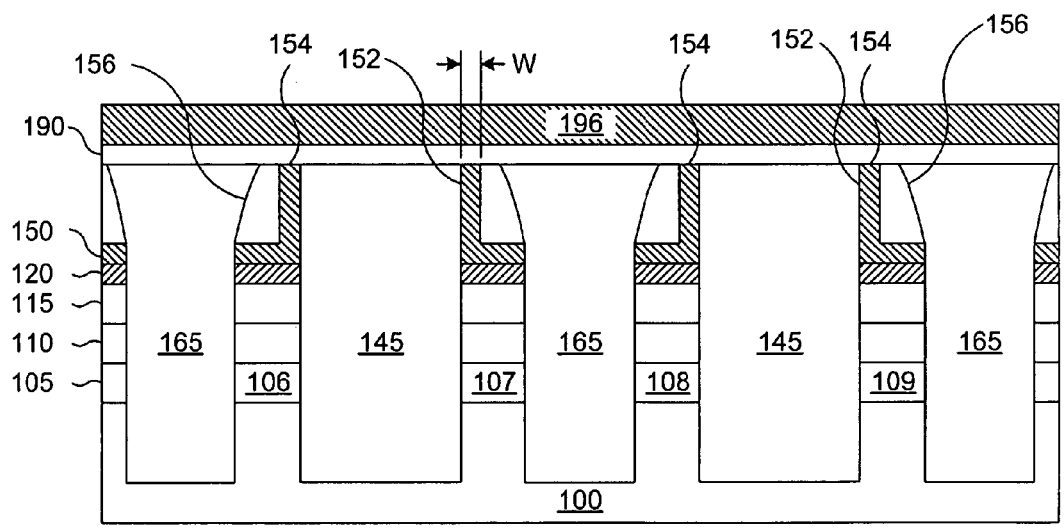
FIG. 22 is a cross-sectional view, taken along a line 22-22' of FIG. 21, illustrating another view of the memory cell.

FIGS. 21 and 22 illustrate cross-sections of an embodiment of phase-change memory cells fabricated according to the present invention. The cross-sectional views in these diagrams illustrate how phase-change memory elements 191 and 192 may be formed by the process just outlined. Phase-change memory elements 191 and 192, which may be formed, for example, of chalcogenide material, each take a form of a contact between phase-change material 190 (FIG. 20) and the surface 154 of the bottom electrode. A length of each contact is L, the distance between silicon nitride spacers 186. Phase-change material 190 (FIG. 20) makes contact with the surface 154 over the distance L. It will be recalled that the first dimension of the contact is W, the width of the surface 154 (FIGS. 12, 13, and 22). A cross-sectional area of the contact is L×W. In typical embodiments, this cross-sectional area can be smaller than $4F^2$, which corresponds to the minimum feature a technology can provide.

The various layers fabricated as illustrated in FIGS. 21 and 22 correspond to typical memory cells that may be selected from the array illustrated in FIG. 1. For example, Table 1 may be used to summarize an example of a correspondence between the phase-change memory cell 55 introduced in FIG. 1 and portions of the structure illustrated in FIGS. 21 and 22.

TABLE 1

| FIG. 1 | FIGS. 21 and 22 |
| --- | --- |
| Bit line 80 | Bit line 107 |
| Isolation device 70 | P+/N− layers 115/110 and silicide layer 120 |
| Bottom electrode 65 | Conducting material 150, lower horizontal portion 151, vertical portion 152, and surface 154 |
| Phase-change memory element 60 | Phase-change memory element 191 |
| Word line 90 | Word line 196 |

Specifically, bit line 80 (FIG. 1) may correspond to bit line 107. Isolation device 70 of phase-change memory cell 55 (FIG. 1) is formed in the illustrated embodiment by N− layer 110 and P+ layer 115. Salicide layer 120 provides electrical contact between the P+ layer 115 of the isolation device 70 (FIG. 1) and bottom electrode 65 (FIG. 1). The bottom electrode 65 (FIG. 1) is formed of conducting material 150 having lower horizontal portion 151, vertical portion 152, and surface 154. The phase-change memory element 60 (FIG. 1) corresponds, for example, to phase-change memory element 191 disposed between surface 154 of conducting material 150 and the word line 196. The word line 196 may correspond to word line 90 (FIG. 1).

Phase-change memory elements corresponding, for example, to phase-change memory element 191 may be operated by applying suitable voltages between word lines and bit lines. That is, a phase-change memory element corresponding to phase-change memory element 191 may be operated by applying suitable voltages between, e.g., bit line 107 the word line 196. Similarly, a phase-change memory element that corresponds to phase-change memory element 192 may be operated by applying suitable voltages between bit line 107 word line 197.

Figure 23:
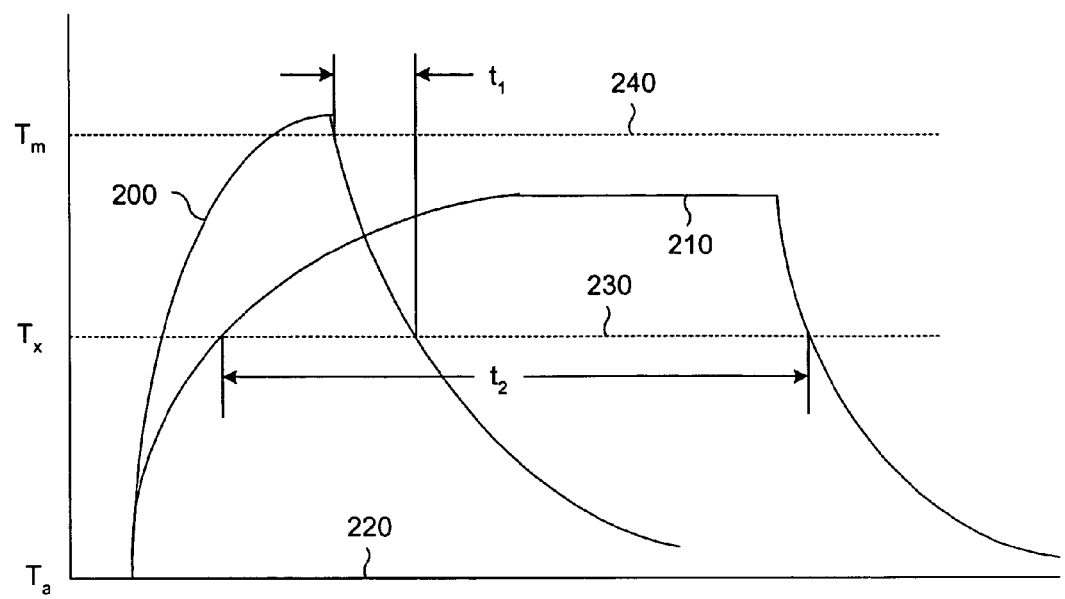
FIG. 23 is a graph of temperature waveforms associated with setting and resetting a phase-change memory cell.

FIG. 23 is a graph of temperature waveforms associated with setting and resetting a phase-change memory cell. The graph portrays temperature on a vertical axis with time on a horizontal axis. A phase-change memory cell may be reset, that is, the phase-change memory cell may be placed into an amorphous state, by applying a amorphizing pulse of current that changes the temperature of a phase-change memory element within the phase-change memory cell according to the amorphizing reset waveform 200. The amorphizing reset waveform 200 causes the temperature of the phase-change memory element to rise from an ambient temperature $T_a$ 220 above a maximum temperature $T_m$ 240 and then to remain above an intermediate temperature $T_x$ 230 for an amount of time $t_1$. With reference to FIG. 21, the phase-change memory element that corresponds to phase-change memory element 191 may be placed into an amorphous state by applying an amorphizing pulse between bit line 107 and word line 196.

A phase-change memory cell may be set, that is the phase-change memory cell may be placed into a crystalline state by applying a crystallizing pulse of current that changes the temperature of the phase-change memory element according to the crystallizing waveform 210. The crystallizing set waveform 210 causes the temperature of the phase-change memory element to rise from the ambient temperature $T_a$ 220 above the intermediate temperature $T_x$ 230 but below the maximum temperature $T_m$ 240 for an amount of time $t_2$. With reference again to FIG. 21, the phase-change memory element that corresponds to phase-change memory element 191 may be placed into a crystalline state by applying a crystallizing pulse between bit line 107 and word line 196.

Typical values for $T_a$ 220, $T_x$ 230, and $Tm_m$ 240 are room temperature, 150 C, and 630 C. Time interval $t_1$ may range from about 0.1 ns to about 20 ns, and $t_2$ may range from about 60 ns to about 100 ns.

In view of the foregoing, it will be understood by those skilled in the art that the methods of the present invention can facilitate formation of phase-change memory devices in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of forming a memory cell, comprising:
   forming a bottom electrode above a substrate, the bottom electrode having a lower horizontal portion and a vertical portion and an upper portion, the vertical portion having a top surface and a side, the top surface having a width;
   forming a first pair of spacers covering the side of the vertical portion;
   forming a second pair of spacers covering a first portion of the top surface of the vertical portion and exposing a second portion of the top surface of the vertical portion, the second portion having an exposed length determined by a distance between the second pair of spacers; and
   forming a phase-change element on the second portion of the top surface of the vertical portion, thereby forming a contact between the phase-change element and the bottom electrode, the contact having an area equal to a product of the width and the exposed length.

2. The method as set forth in claim 1, wherein the forming of the phase-change element comprises depositing a chalcogenide material.

3. The method as set forth in claim 2, further comprising:
providing a self-aligned bit line in the substrate;
forming an isolation device on the bit line; and
forming a silicide on the isolation device, the silicide making contact with the bottom electrode.

4. The method as set forth in claim 3, wherein the forming of the isolation device comprises forming a PN diode.

5. The method as set forth in claim 1, wherein the forming of the bottom electrode comprises depositing a film of conducting material above the substrate.

6. The method as set forth in claim 1, wherein the bottom electrode further comprises an upper horizontal portion.

7. The method as set forth in claim 6, wherein the depositing of a phase-change element on the second portion of the bottom electrode comprises:
depositing a spacer material on the surface;
removing a portion of the spacer material to form spacers and to expose the second portion; and
depositing a layer of phase-change material on the spacers and on the second portion.

8. The method as set forth in claim 7, wherein the depositing of the spacer material comprises depositing silicon nitride.

9. The method as set forth in claim 6, wherein the depositing of the film of conducting material comprises depositing polysilicon.

10. The method as set forth in claim 6, wherein the depositing of the film of conducting material comprises depositing metal.

11. The method as set forth in claim 6, further comprising forming a word line on the phase-change element.

12. The method as set forth in claim 1, further comprising forming a first isolation region in and above the substrate, the first isolation region having a sidewall which makes contact with the second portion of the bottom electrode.

13. The method as set forth in claim 12, wherein the forming of the first isolation region comprises depositing HDP oxide.

14. The method as set forth in claim 1, further comprising forming a second isolation region in and above the substrate, the second isolation region having a sidewall which makes contact with the first portion of the bottom electrode.

15. The method as set forth in claim 14, wherein the forming of the second isolation region comprises depositing HDP oxide.

16. A method of forming a memory cell, comprising:
forming a bit line on a substrate;
forming an isolation device on the bit line;
forming at least one insulating layer over the isolation device;
removing portions of the insulating layer, the isolation device, the bit line and the substrate to form a first trench therein;
filling the first trench to form a first isolation region;
forming a bottom electrode over the first isolation region and the isolation device, wherein the bottom electrode has a lower horizontal portion, a vertical portion and an upper portion, the vertical portion having a top surface and a side, the top surface having a width;
forming a first pair of spacers covering the side of the vertical portion;
forming a second pair of spacers covering a first portion of the top surface of the vertical portion and exposing a second portion of the top surface of the vertical portion, the second portion having an exposed length determined by a distance between the second pair of spacers;
removing portions of the lower horizontal portion of the bottom electrode, the isolation device, the bit line and the substrate using the spacers as a mask to form a second trench therein;
filling the second trench to form a second isolation region;
removing portions of the second isolation region, the spacers and the bottom electrode until the vertical portion of the bottom electrode is exposed; and
forming a phase-change element on the second portion of the top surface of the vertical portion, thereby forming a contact between the phase-change element and the bottom electrode, the contact having an area equal to a product of the width and the exposed length.

17. A method of forming a memory cell, comprising:
forming a bottom electrode above a substrate, the bottom electrode having a lower horizontal portion and a vertical portion and an upper portion, the vertical portion having a top surface and a side, the top surface having a width which is determined by the thickness of the lower horizontal portion;
forming a first plurality of spacers covering the side of the vertical portion;
forming a second plurality of spacers distanced with a length on the top surface of the vertical portion; and
forming a phase-change element on top surface of the vertical portion and on the second plurality of spacers, thereby forming a contact between the phase-change element and the bottom electrode, the contact having an area equal to a product of the width and the length.

* * * * *